United States Patent [19]
Sessions

[11] Patent Number: 6,166,580
[45] Date of Patent: Dec. 26, 2000

[54] CMOS HIGH-TO-LOW VOLTAGE BUFFER

[75] Inventor: D. C. Sessions, Phoenix, Ariz.

[73] Assignee: VLSI Technology, Inc., San Jose, Calif.

[21] Appl. No.: 09/216,701

[22] Filed: Dec. 18, 1998

[51] Int. Cl.[7] ...................................................... H03L 5/00
[52] U.S. Cl. .............................. 327/333; 326/62; 326/80; 326/81
[58] Field of Search ..................................... 327/333, 108, 327/112, 379, 389, 391; 326/62, 63, 68, 80, 81

[56] References Cited

U.S. PATENT DOCUMENTS

| | | | |
|---|---|---|---|
| 5,270,944 | 12/1993 | Kuroda et al. | 716/3 |
| 5,287,393 | 2/1994 | Miwada | 377/60 |
| 5,534,801 | 7/1996 | Wu et al. | 327/72 |
| 5,821,136 | 10/1998 | Chan et al. | 438/158 |

Primary Examiner—Tuan T. Lam
Attorney, Agent, or Firm—Wagner Murabito & Hao LLP

[57] ABSTRACT

A voltage-buffer circuit for changing an input signal at a first voltage range to an output signal at a second voltage range. In one embodiment, the voltage-buffer circuit is comprised of an input lead for receiving an input signal at a first voltage range, a plurality of transistors coupled to the input lead, and an output lead coupled to the plurality of transistors. The purpose of the transistors is to convert the input signal at the first voltage range to an output signal at a second voltage range. The output lead is for receiving the output signal at the second voltage range from said plurality of transistors. The plurality of transistors are arranged into a plurality of stages, with at least one of the transistors having a gate oxide of a first thickness and at least one of the transistors having a gate oxide of a second thickness, where the first thickness is less than said second thickness.

25 Claims, 9 Drawing Sheets

CMOS HIGH-TO-LOW VOLTAGE BUFFER

TECHNICAL FIELD

The present claimed invention relates to the field of semiconductor devices. Specifically, the present claimed invention relates to an apparatus and a method for reducing voltage with a high-to-low voltage buffer.

BACKGROUND ART

The core of an integrated circuit (IC) uses a high quantity of transistors to perform the required logic functions. Because the quantity of transistors used is so high, even a small reduction in the transistor size can create a significant overall reduction in chip area. Size reduction in a transistor can be accomplished by several methods. One method simply reduces the longthwidth of the device. For example, the trend of length-widths has gone from 600 nanometers to 350 nanometers to 180 nanometer over the past few years. Another method of reducing transistor size is to reduce the thickness of the gate oxide portion of the transistor. A thinner gate oxide improves the resolution of the patterned circuit because it reduces the shadow cast from the gate oxide protruding above the substrate.

However, reductions in transistor size have subsequently increased the sensitivity of the transistor, thereby requiring a lower operating voltage, for example 1.8 volts maximum operating voltage. Yet the input/output (I/O) signals in the IC have remained at a higher range of about 3.3 volts. Hence, for essentially the first time, the I/O signal voltage exceeds the maximum allowable voltage the IC core can withstand. Because of the excessive I/O signal voltage, a demand arose for a high-to-low voltage buffer to reduce the voltage of a high logic signal.

By reducing the voltage of a high logic signal, an IC core can be designed for this lower maximum operating voltage. For example, a less sensitive portion of a circuit can use a high logic signal, for example 3.3 volts, and still communicate to a more sensitive portion of a circuit, e.g. the IC core, that can only withstand a reduced high logic signal, for example 1.8 volts. By operating at a lower maximum voltage, a portion of the circuit, e.g. the IC core, can be designed and manufactured to be more sensitive, with corresponding benefits of consuming less power, operating faster, and occupying less chip area. Consequently, a need exists for a voltage buffer circuit that will reduce the I/O signal voltage to a level that the IC core can withstand.

Figure 1:
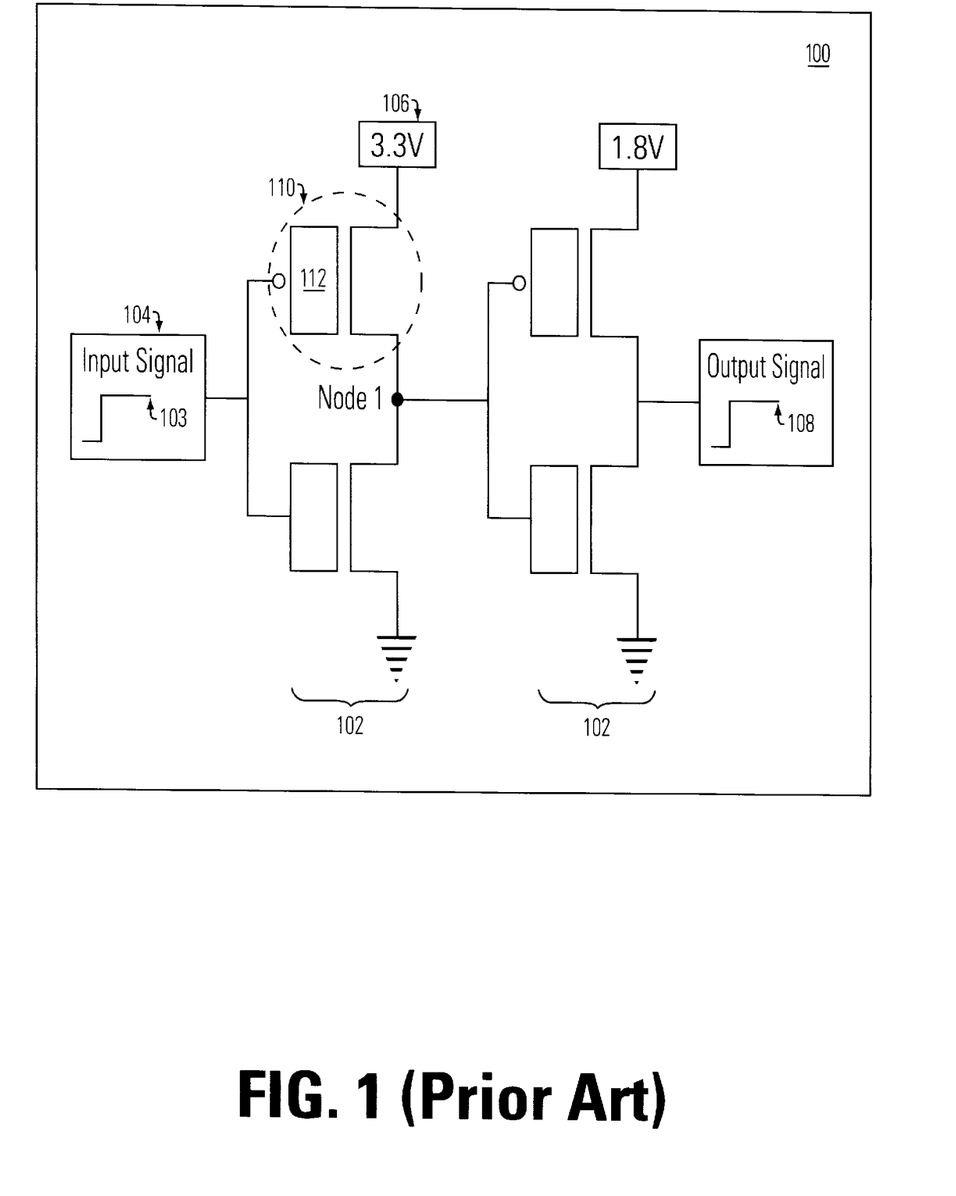
FIG. 1 is an electrical schematic of a conventional two-stage voltage buffer circuit.

As shown in Prior Art FIG. 1, one version of a prior art voltage buffer circuit 100 comprises two inverters 102 of a complementary metal oxide semiconductor (CMOS) transistor configuration. To withstand the voltage 103 of the high input signal 104 and the voltage of the first power supply 106 when compared to the output voltage 108, the individual transistors 110 require a thick gate oxide 112. Unfortunately, the thick gate oxide is undesirable because it causes the device to have a longer propagation delay time (e.g., longer switching time), thereby consuming more power. The higher power consumption and the longer switching time are directly attributed to the circuit design using transistors with a thick gate oxide that require more power and time to activate and deactivate (e.g. switch from low to high and from high to low).

Figure 2:
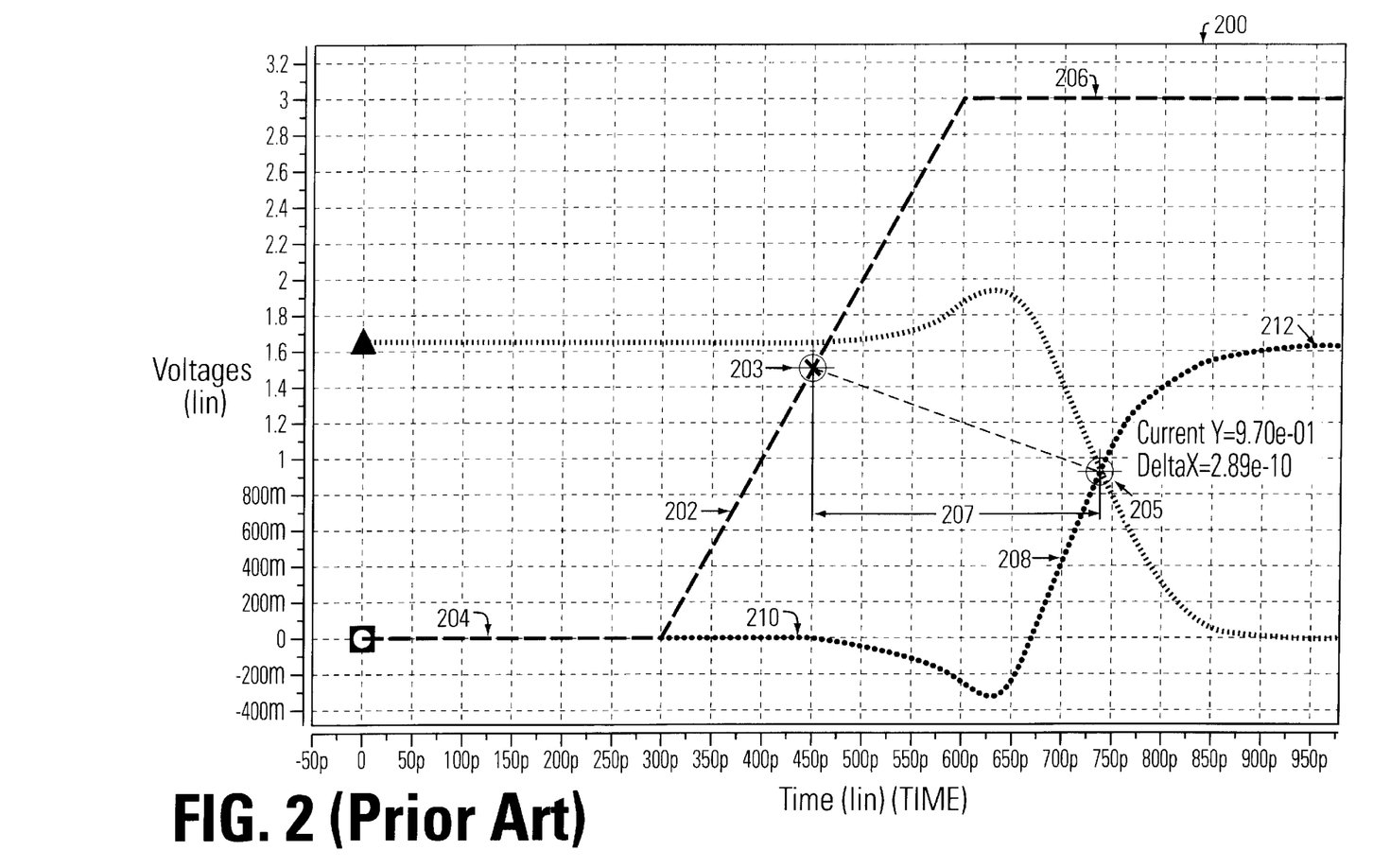
FIG. 2 is a graph of the input and output voltage performance of the conventional two-stage voltage buffer circuit of Prior Art FIG. 1, with graph axes: Voltage vs. Time.

Prior Art FIG. 2 is a graph 200 of the performance of the prior art voltage buffer circuit 100. The graph 200 illustrates the voltage changes in the voltage buffer circuit 100 over time as input signal 202 changes from low logic level 204 to high logic level 206 and correspondingly, the output signal 208 changes from low logic level 210 to high logic level 212. The propagation delay time 207 is the time required for output signal 208 to react to the change in input signal 202. Technically, the propagation delay time 207 is the difference between: 1) the input signal 202 reaching the 50% point 203 of its voltage transition; and 2) the output signal 208 reaching the 50% point 205 of its voltage transition. Hence, for the prior art voltage buffer circuit illustrated in Prior Art FIG. 1, the propagation delay time is approximately 289 picoseconds (i.e., from approximately the 450 picosecond mark to approximately the 739 picosecond mark). Considering the limitations of the prior art voltage buffer circuit, an apparent need exists for a voltage buffer circuit with low power consumption and with low propagation delay time (e.g. faster switching speed).

The prior art attempted to satiate this need by reducing the gate oxide thickness for the transistors used in the voltage buffer circuit. Unfortunately, when thin gate oxide transistors were used in the prior art voltage buffer circuit, they degraded quickly and ultimately failed to operate within a short period of time. The failure was attributed to degradation of the oxide layer from the electrical field which was excessively high in comparison to the thin gate oxide. The excessive electrical field was theorized to have created trapped charges in the oxide layer, knocked out atoms from the oxide layer, and degraded the effective carrier mobility in the device. Consequently, the prior art thin gate oxide transistors failed to satisfy the need for a voltage buffer circuit with low power consumption and with low propagation delay time. Hence, a need exists for a robust voltage buffer circuit that can withstand the high I/O voltage and produce a low core voltage.

In summary, there exists a need for a high-to-low voltage buffer that will reduce the I/O signal voltage range to a level that the IC core can withstand. Additionally, there exists a need for the voltage buffer circuit to operate with low power consumption and with low propagation delay time (e.g. faster switching speed). Finally, a need exists for the same voltage buffer circuit to have a robust capability for managing the required voltage levels without a quick or significant degradation in performance.

DISCLOSURE OF THE INVENTION

The present invention provides a high to low voltage range buffer circuit that will reduce the I/O signal voltage range to a level that the IC core can withstand. The present invention further provides a voltage buffer circuit that operates with low power consumption and with a low propagation delay time (e.g. faster switching speed). Finally, the present invention has a robust capability for managing the required voltage levels without a quick or significant degradation in performance.

Specifically, in one embodiment, the present invention recites a voltage-buffer circuit comprised of an input lead for receiving an input signal at a first voltage range, a plurality of transistors coupled to the input lead, and an output lead coupled to the plurality of transistors. The purpose of the transistors is to convert the input signal at the first voltage range to an output signal at a second voltage range. The output lead is for receiving the output signal at the second voltage range from said plurality of transistors. The plurality of transistors are arranged into a plurality of stages, with at least one of the transistors having a gate oxide of a first thickness and at least one of the transistors having a gate oxide of a second thickness, where the first thickness is less than said second thickness.

In another embodiment, the present invention recites a method for changing an input signal at a first voltage range to an output signal at a second voltage range in an electrical circuit having a plurality of transistors. The method is accomplished by several steps. One step receives an input signal at a first voltage range in the electrical circuit. Another step converts the input signal at the first voltage range to an output signal at the second voltage range using a plurality of transistors wherein at least one of the transistors has a thin gate oxide and at least one of the transistors has a thick gate oxide.

These and other objects and advantages of the present invention will no doubt become obvious to those of ordinary skill in the art after having read the following detailed description of the preferred embodiments illustrated in the various drawing figures.

BRIEF DESCRIPTION OF THE DRAWINGS

The accompanying drawings, which are incorporated in and form part of this specification, illustrate embodiments of the invention and, together with the description, serve to explain the principles of the invention.

PRIOR ART

PRIOR ART

The drawings referred to in this description should be understood as not being drawn to scale except as specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

VOLTAGE BUFFER CIRCUIT DESCRIPTION

Figure 3:
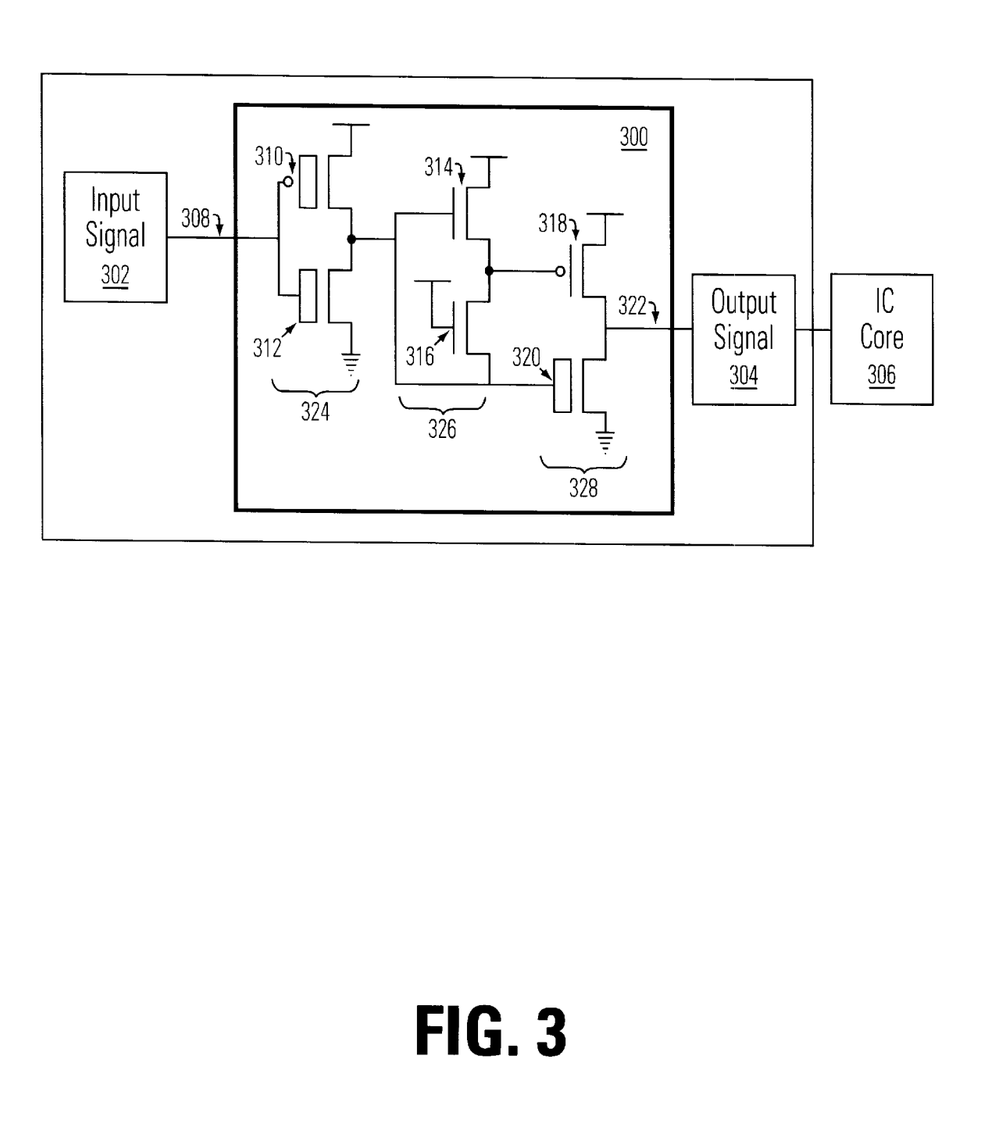
FIG. 3 is a illustration of a voltage buffer circuit buffering signals from the input signal to the IC core in accordance with one embodiment of the present invention.

With reference now to FIG. 3, a voltage-buffer circuit 300 is illustrated within an IC. Voltage-buffer circuit 300 changes input signal 302 at first voltage to output signal 304 at second voltage to be supplied to IC core 306. The following discussion will pertain to electrical schematics of a high-to-low voltage range buffer circuit and corresponding graphs of voltage conditions of the buffer circuit. This discussion will then be followed by a detailed description of the operation of the present voltage buffer circuit 300. Referring still to FIG. 3, voltage buffer circuit 300 is comprised of an input lead 308 for receiving input signal 302 at a first voltage range and a plurality of transistors 310 and 312 coupled to input lead 308. Voltage buffer circuit 300 further includes transistors 314 and 316 coupled to transistors 310 and 312. Additionally, voltage buffer circuit 300 includes transistors 318 and 320 that are coupled both to transistors 314 and 316 and to an output lead 322. The plurality of transistors are arranged into a plurality of stages 324, 326 and 328. At least one of transistors 310, 312, 314, 316, 318 or 320 has a gate oxide of a first thickness and at least one of transistors 310, 312, 314, 316, 318 or 320 has a gate oxide of a second thickness. The first thickness is less than the second thickness. The purpose of transistors 310, 312, 314, 316, 318 and 320, and of stages 324, 326, and 328 is to convert input signal 302 at the first voltage range to output signal 304 at a second voltage range. Output lead 322, coupled to the transistors, is intended to receive output signal 304 of a second voltage range. Output signal 304, at the reduced voltage range, is then communicated to IC core 306. While the present embodiment utilizes a plurality of transistors 310, 312, 314, 316, 318 and 320 in a plurality of stages 324, 326 and 328, transistors 310, 312, 314, 316, 318 and 320 could easily be rearranged, regrouped, or not grouped in stages at all, and yet maintain the inventive aspect of the present invention.

In one embodiment of the present invention, the first thickness of a gate oxide portion of at least one of transistors 310, 312, 314, 316, 318 or 320 is less than approximately 40 Angstroms (Å), while the second thickness of a gate oxide portion of at least one of transistor 310, 312, 314, 316, 318 and 320 is greater than approximately 40 Angstroms (Å). Depending upon performance and manufacturing goals, the two thicknesses of the respective gate oxides can vary over a substantial range while maintaining the inventive aspect of the present invention.

Still referring to FIG. 3, one embodiment of the present invention specifies that at least one of transistors 310, 312, 314, 316, 318 and 320 is of a first conductivity-type (e.g. n-type conductivity) and at least one of transistors 310, 312, 314, 316, 318 and 320 is of a second conductivity-type (e.g. p-type conductivity). In one embodiment, the first conductivity-type is n-type conductivity and the second conductivity-type is p-type conductivity. The coupling of the two conductivity-types forms the CMOS inverter. While the present embodiment utilizes a metal oxide semiconductor field effect transistor (MOSFET), the present invention is equally suited to other forms of transistors such as a junction field effect transistor (JFET), etc.

Figure 4:
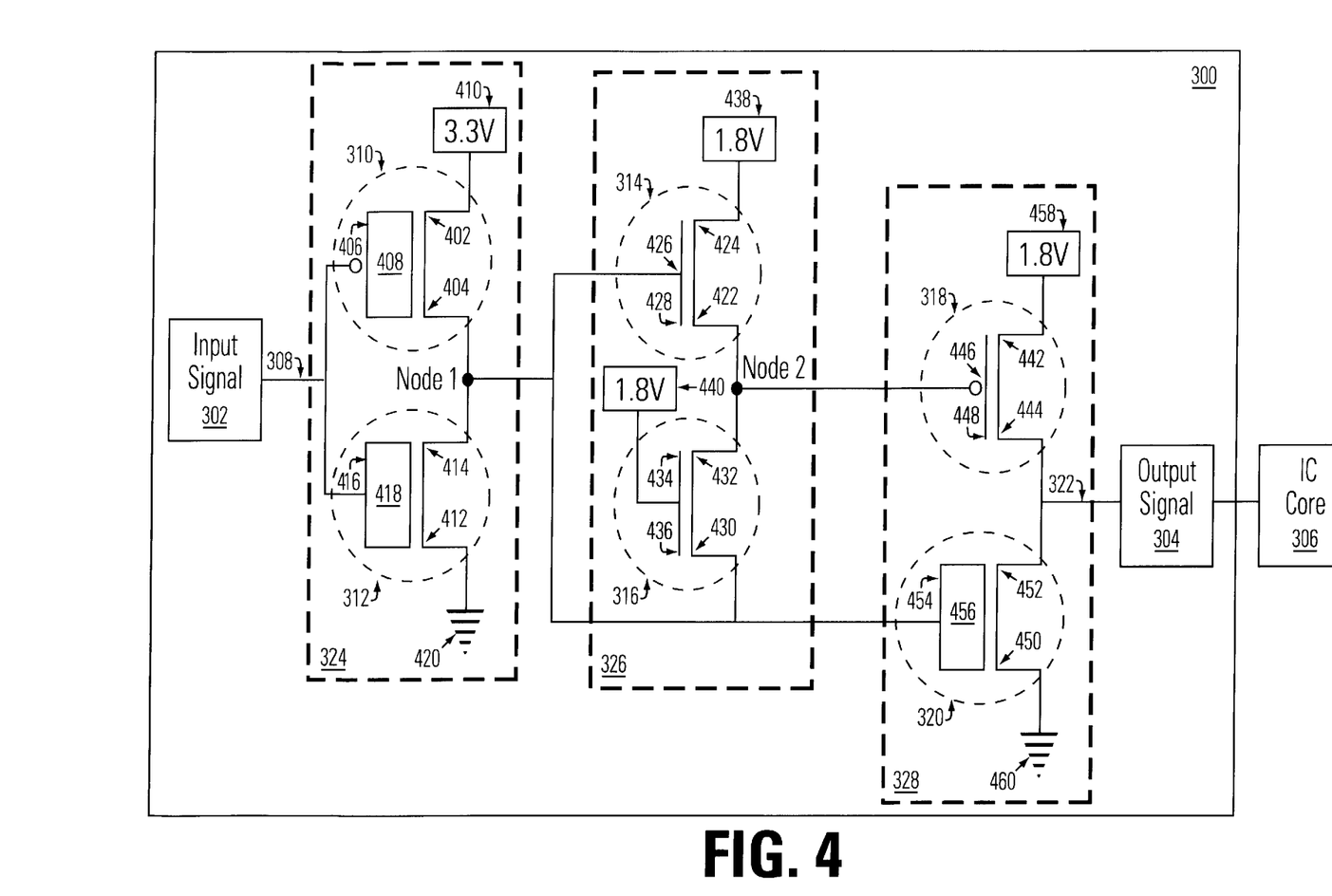
FIG. 4 is an electrical schematic of a three-stage voltage buffer circuit illustrating the composition of the stages in accordance with one embodiment of the present invention.

Referring now to FIG. 4, one embodiment of the voltage-buffer circuit 300 of FIG. 3 is presented in detail. First stage 324 comprises first transistor 310, second transistor 312, first power source 410, and ground 420. First transistor 310 is of a first conductivity-type having a source 402, a drain 404, a gate 406, and a gate oxide 408 of a second thickness. Source 402 of first transistor 310 is coupled to first power source 410 at a third voltage and to second transistor 312 of a second conductivity-type having a source 412, a drain 414, a gate 416, and a gate oxide 418 of a second thickness. In this embodiment, drain 414 of second transistor 312 and drain 404 of first transistor 310 are coupled to Node 1 in voltage buffer circuit 300. Source 412 of second transistor 312 is coupled to ground 420 while gate 410 of first transistor 310 and gate 416 of second transistor 312 are coupled to input lead 308.

Still referring to FIG. 4, second stage 326 of voltage-buffer circuit 300 is illustrated. Second stage 326 is comprised of a first transistor 314, a second transistor 316, a second power source 438, and a fourth power source 440. First transistor 314 is of a second conductivity-type having a source 422, a drain 424, a gate 426, and a gate oxide 428 of a first thickness. Second transistor 316 of second stage 326 is of a second conductivity-type having a source 430 a drain 432, a gate 434, and a gate oxide 436 of a first thickness. Drain 424 of first transistor 314 is coupled to a second power source 438 at a fourth voltage while drain 432 of second transistor 316 and source 422 of first transistor 314 are coupled to a Node 2 in second stage 326. Source 430 of second transistor 316 and gate 426 of first transistor 314 are coupled to Node 1 of first stage 324, while gate 434 of second transistor 316 is coupled to a fourth power source 440 at a sixth voltage.

Still referring to FIG. 4, third stage 328 of voltage-buffer circuit 300 is illustrated in detail. Third stage 328 is comprised of a first transistor 318 of a first conductivity-type having a source 442, a drain 444, a gate 446, and a gate oxide 448 of a first thickness. Third stage 328 is also comprised of a second transistor 320 of a second conductivity-type having a source 450, a drain 452, a gate 454, and a gate oxide 456 of a second thickness. Source 442 of first transistor 318 is coupled to a third power source 458 at a fifth voltage while drain 452 of second transistor 320 and drain 444 of first transistor 318 are coupled to output lead 322. Source 450 of second transistor 320 is coupled to ground 460 while gate 446 of first transistor 318 is coupled to Node 2 of second stage 326. Gate 454 of second transistor 320 is coupled to Node 1 of first stage 324.

The function of first stage 324 and of third stage 328 of voltage buffer circuit 300 is to invert the logic level of input signal 302 and to reduce the voltage level of the high logic signal to a lower value. While the present embodiment specifies the use of a CMOS inverter, alternative inverters may be used while still maintaining the inventive aspect of the present invention. For example, an NMOS inverter with two NMOS transistors, or an enhancement-loaded inverter with a saturated load, or an NMOS inverter with a resistor load could all be used in the present invention. Likewise, the concepts of the present invention are equally suited to use of alternative transistor configurations, such as JFET, etc., in voltage buffer circuit 300.

The function of second stage 326 is to reduce the voltage level of the high logic signal to a lower value. While the present embodiment uses NMOS transistors for this purpose, the concept of the invention is also well-suited to using other forms of circuitry that will reduce the voltage including, but not limited to resistors, transistors, and other electronic components.

Furthermore, while the present embodiment describes the source and drain of the transistors as having specific locations, under certain conditions, the source and the drain actually reverse. This situation arises because, in theory, the source and the drain of a MOSFET transistor can only be identified after the polarities of the applied voltages have been established. For example, in an NMOS transistor, the more positive electrode will be defined as a drain. As an example, second transistor 316 of second stage 326 has drain 432 connected to drain 424 of first transistor 314 in that same stage. For an input signal going from low to high logic levels, this identification of the electrodes is correct because the top electrode will be more positive than the lower electrode for the voltage and current levels in the circuit at that given condition. However, for an input signal going from high to low logic levels, the identification of the electrodes is actually reversed. Hence, the electrode labels of 'drain' and 'source' should be reversed.

OPERATION OF CIRCUIT

The following is a detailed description of the operation of present circuit 300. More specifically, the following description illustrates what transistors turn on or off in the voltage buffer circuit 300 with respect to input signal 302 and to other voltages present in voltage buffer circuit 300. It is understood that a transistor will switch from on to off when the voltage between the gate and the source of the transistor, Vgs, is above or below the threshold voltage, Vt, depending on whether the transistor is a PMOS or an NMOS configuration and whether it is an enhancement mode or depletion mode configuration. The transistors described in the figures below are enhancement mode PMOS and NMOS transistors. However, the present invention is also suited to transistors of different configuration such as JFET transistors and depletion mode transistors, etc.

Figure 5:
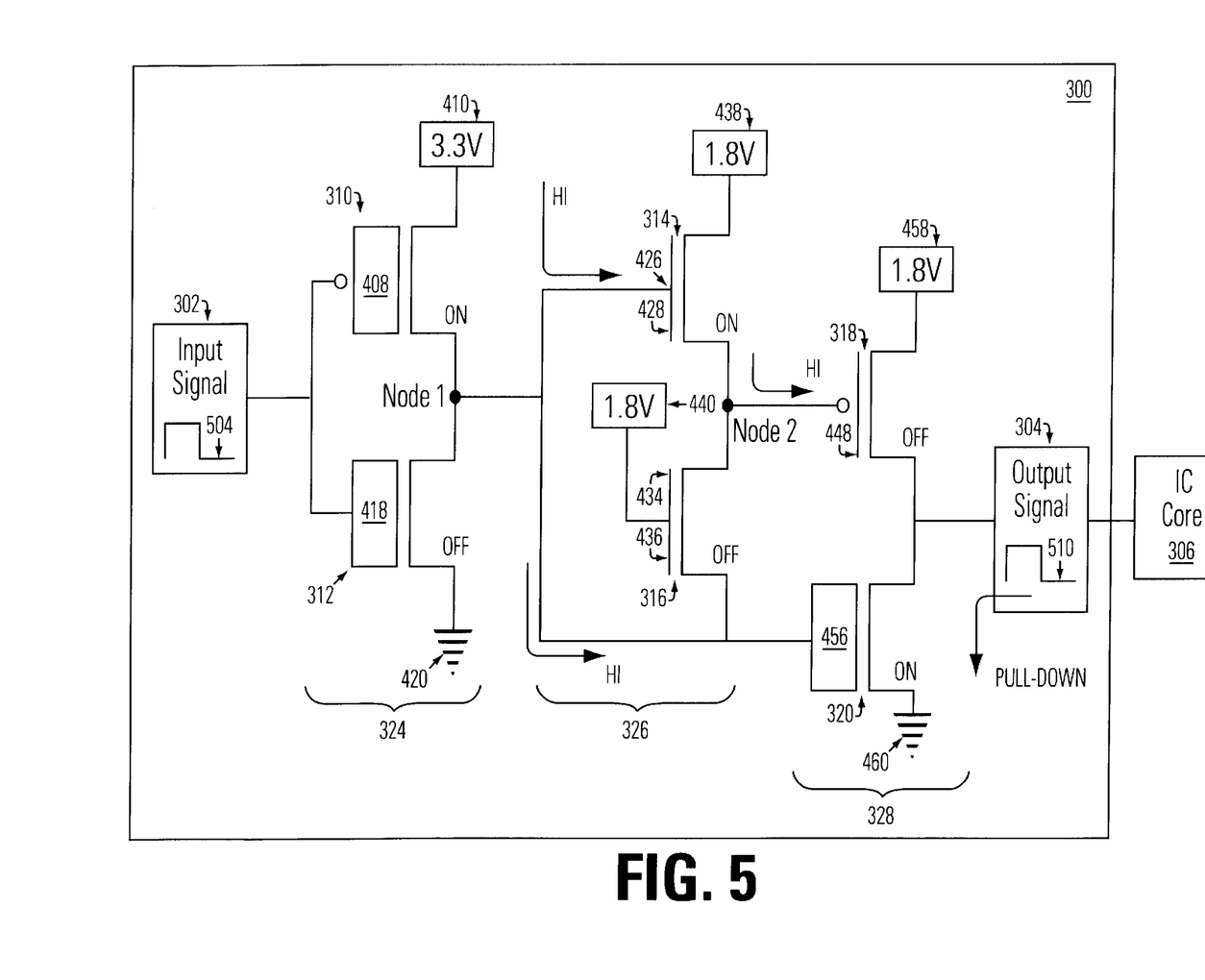
FIG. 5 is an electrical schematic of a three-stage voltage buffer circuit operating with a low input signal in accordance with one embodiment of the present invention.

Referring now to FIG. 5, voltage buffer circuit 300 is shown indicating the state of transistors 310, 312, 314, 316, 318, and 320 under various operating conditions. In the example of FIG. 5, voltage buffer circuit 300 is presented with an input signal 302 at a LOW logic level 504. Because low input signal 302 is connected to gate 406 of PMOS transistor 310, and because power source 410 is connected to an electrode of transistor 310, transistor 310 turns on. This allows power source 410 to provide power through transistor 310. At the same time, low input signal 302 turns off NMOS transistor 312, thereby isolating ground 420. This has the effect of allowing the power source 410 to provide power to Node 1 in voltage buffer circuit 300. Note that both transistor 310 and transistor 312 have a thick gate oxide 408 and 418 respectively, to withstand the high voltage range of input signal 302. More particularly, in the present embodiment, gate oxide 408 and gate oxide 418 have a thickness of greater than approximately 40Å.

Similarly, because Node 1 is coupled to gate 426 of NMOS transistor 314, it provides power from power source 410 to gate 426 while one electrode of NMOS transistor 314 receives a voltage from power source 438. Because of these voltage conditions, NMOS transistor 314 turns on. At the same time, Node 1 is coupled to an electrode of NMOS transistor 316. Because neither the voltage level at Node 1 and the electrode of NMOS transistor 316, nor the voltage level at Node 2 and the other electrode of NMOS transistor 316 is less than the voltage level of fourth power source 440 coupled to gate 434 of NMOS transistor 316, NMOS transistor 316 is off. With NMOS transistor 314 on and NMOS transistor 316 off, second power source 438 can provide power through NMOS transistor 314 to Node 2 in voltage buffer circuit 300. Note that NMOS transistor 314 and NMOS transistor 316 have thin gate oxides, 428 and 436 respectively, thereby yielding a quicker switching speed and a lower power consumption than the thick gate oxide transistors. NMOS transistor 314 and NMOS transistor 316 can have a thin gate oxide because they only need to withstand the voltage difference between power supply 410 and power supplies 438 and 440 rather than the voltage difference between power supply 410 and ground.

Because Node 2 provides a high logic level voltage equivalent to the voltage of second power source 438 to gate 446 of PMOS transistor 318, and because third power source 458 provides power to an electrode of PMOS transistor 318, PMOS transistor 318 is off. Similarly, because Node 1 communicates the high logic voltage of first power source 410 to the gate of NMOS transistor 320, NMOS transistor 320 turns on. With PMOS transistor 318 off and NMOS transistor 320 on, output signal 304 has a direct connection to ground 460 through NMOS transistor 320. This provides a pull-down circuit creating an output signal 304 at a low voltage level 510, essentially equal to ground voltage 460. Note that because NMOS transistor 320 is coupled to ground 460 while its gate 454 can see a voltage level of first power source 410, it must have a thick gate oxide 456. PMOS transistor 318, on the other hand, has its gate 446 at the lower voltage of second power source 438, and hence, can utilize a thin gate oxide 448 with all its intrinsic benefits.

Figure 6:
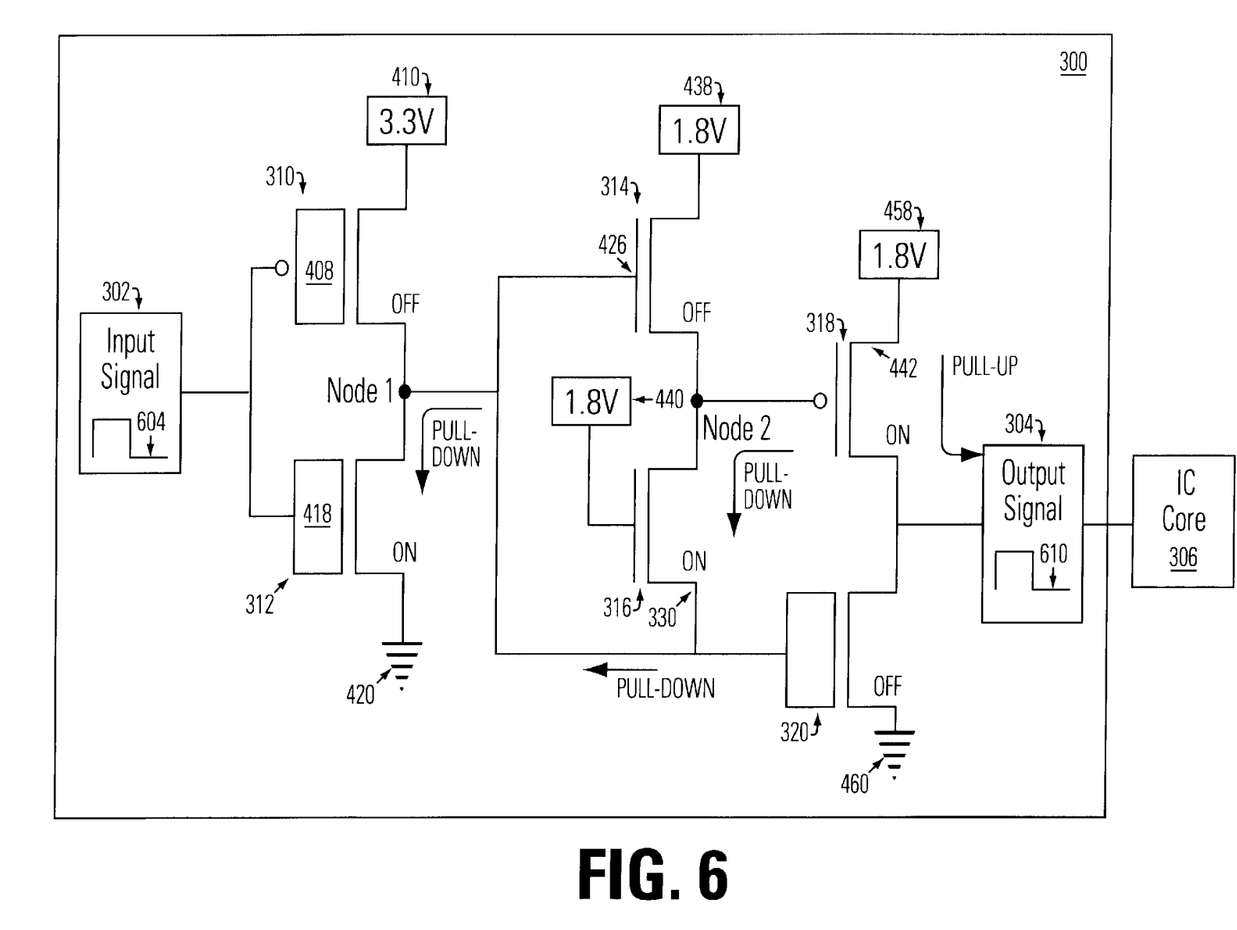
FIG. 6 is an electrical schematic of a three-stage voltage buffer circuit operating with a high input signal in accordance with one embodiment of the present invention.

Referring now to FIG. 6, voltage buffer circuit 300 is shown indicating the state of transistors 310, 312, 314, 316, 318 and 320 under various operating conditions. In the example of FIG. 6, voltage buffer circuit 300 is presented with an input signal 302 at a HIGH logic level 604. The description of its operation is very similar to the description given for FIG. 5, albeit with opposite logic levels. Because high input signal 302 is connected to gate 406 of PMOS transistor 310, and because first power source 410 is connected to an electrode of PMOS transistor 310, PMOS transistor 310 turns off. At the same time high input signal 302 turns on NMOS transistor 312, thereby coupling Node 1 to ground 420 via NMOS transistor 312. This has the effect of providing a pull-down circuit to Node 1 in voltage buffer circuit 300. Note that both PMOS transistor 310 and NMOS transistor 312 have a thick gate oxide 408 and 418, respectively, to withstand high voltage level 604 of input signal 302.

Similarly, because Node 1 is coupled to gate 426 of NMOS transistor 314, it pulls gate 426 down to ground 420 through NMOS transistor 314 while electrode 424 of NMOS transistor 314 receives a voltage from second power source 438. Because of these voltage conditions, NMOS transistor 314 turns off. At the same time, Node 1 provides ground 420 to electrode 430 of NMOS transistor 316. Because fourth power source 440, coupled to gate 434 of NMOS transistor 316, is higher than ground 420, communicated to electrode 430, NMOS transistor 316 turns on. With NMOS transistor 316 on and NMOS transistor 314 off, ground 420 is provided through NMOS transistor 316 to Node 2 in voltage buffer circuit 300. Note that NMOS transistors 314 and 316 have a thin gate oxide 428 and 436, respectively, and thereby have a quicker switching speed and a lower power consumption than the thick gate oxide transistors. Transistors 314 and 316 can have thin gate oxides 428 and 436 because they only need to withstand the voltage difference between power supply 410 and power supplies 438 and 440 rather than the voltage difference between power supply 410 and ground.

In third stage 328 of buffer circuit 300, Node 2 provides a low voltage logic level of ground 420 to gate 446 of PMOS transistor 318, while third power source 458 provides power to electrode 442 of PMOS transistor 318. Consequently, PMOS transistor 318 is on. Similarly, because Node 1 provides ground 420 to gate 454 of NMOS transistor 320, NMOS transistor 320 is off. With PMOS transistor 318 on and NMOS transistor 320 off, output signal 304 is pulled up to the value of third power source 458, e.g. creating a high logic level 610 for output signal 304. PMOS transistor 318 only requires a thin gate oxide 448 because the voltage difference between its gate 446 to its electrode 442 is low enough. Specifically, gate 446 is coupled to ground 420 while electrode 442 is coupled to power source 458.

Figure 7:
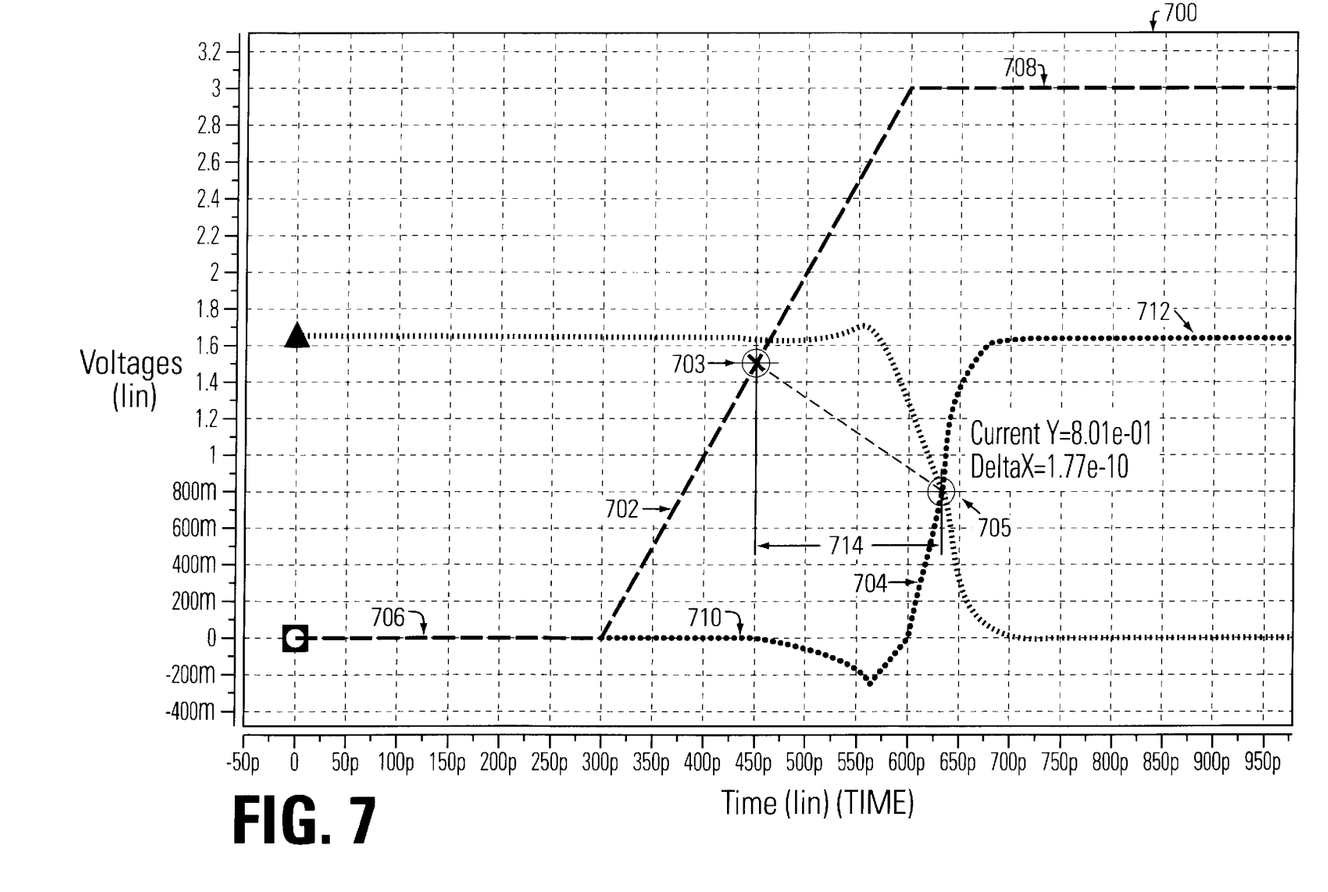
FIG. 7 is a graph of the input and output voltage performance of the three-stage voltage buffer circuit, in accordance with one embodiment of the present invention, with graph axes: Voltage vs. Time.

FIG. 7 presents a graph 700 of the performance of the present voltage buffer circuit 300 illustrated in FIGS. 3–6. Graph 700 represents the results of a computer simulation, performed by a program entitled Simulation Program Integrated Circuit Emphasis ("SPICE"), of the voltage buffer circuit 300. In graph 700, the curves illustrate the time required for a change in input signal 302 to be processed through voltage buffer circuit 300 and for the resultant output signal 304 to reach its stable logic level. As noted, input signal 302 changes from a low logic level 706 to high logic level 708 as prompted by portions of voltage buffer circuit 300. Correspondingly, the voltage value for output signal 704 changes from a low logic level 710 to a high logic level 712.

As noted on graph 700, high logic level 708 for input signal 302 is greater than high logic level 712 of output signal 304. Propagation delay time 714 is the time required for output signal 304 to react to the change in input signal 302. Technically, propagation delay time 714 is defined as the delay between 1) input signal 302 reaching the 50% point 703 of its voltage transition, and 2) output signal 304 reaching the 50% point 705 of its voltage transition. Hence, for voltage buffer circuit 300 illustrated in FIGS. 3–5, the propagation delay time is approximately 177 picoseconds (i.e., from approximately 450 picosecond mark to approximately the 622 picosecond mark). This is a substantial improvement over the prior art propagation delay of 289 picoseconds (see Prior Art FIG. 2). The capacitance of transistors 310, 312, 314, 316, 318 and 320 in voltage buffer circuit 300 is a factor in determining switching speed. Specifically, the decreased capacitance of the present voltage buffer circuit 300 illustrated in FIGS. 3–6 reduces the switching time required for voltage buffer circuit 300 to respond to a change in logic.

The dynamic operation of MOS transistors consumes power whereas static operation only consumes an infinitesimal leakage current. Power consumption, referred to as the power delay product ("PDP"), is an indication of the energy consumed in a circuit for a single logic decision (e.g., switching from high to low logic level). The PDP, measured in joules, is defined in equation (1) as:

$$PDP = P_{D(av)} \cdot t_p \qquad (1)$$

In equation (1), $P_{D(av)}$ is defined as the average power consumption while $t_p$ is the average propagation delay for the device. For a fixed supply voltage, the average load current used to calculate power is proportional to the maximum supply current. The average propagation delay is directly proportional to the capacitance and the voltage swing and inversely proportional to the maximum supply current. As a result, the PDP can be reduced by reducing the logic swing, reducing the capacitance of the circuit, or reducing the supply voltage. Hence, the reduced capacitance of the voltage buffer circuit 300, responsible for the reduced propagation delay illustrated in FIG. 7, is also responsible for the reduction in the PDP, the power consumption of the circuit.

Besides faster switching and lower power consumption, the voltage buffer circuit 300 also has the beneficial properties of robust performance and long life span. The robust performance and long life span are attributed to the incremental stepping of voltages through the voltage buffer circuit 300. The incremental stepping of voltages utilize power sources 410, 438, 440, and 458 in voltage buffer circuit 300 prevents excessively high voltage levels across transistors 310, 312 and 320 having a thick gate oxide. More importantly, the incremental stepping of voltages from power sources 410, 438, 440, and 458 prevents unreasonably high voltage levels across transistors 314, 316, and 318 having a thin gate oxide. A transistor with a thin gate oxide is more sensitive to excessive voltage differentials. Hence, the present voltage buffer circuit 300 of FIGS. 3–6 overcomes the prior art limitation of excessive voltage levels across a transistor with thin gate oxides that lead to premature degradation and failure.

VOLTAGE BUFFER METHOD

Figure 8:
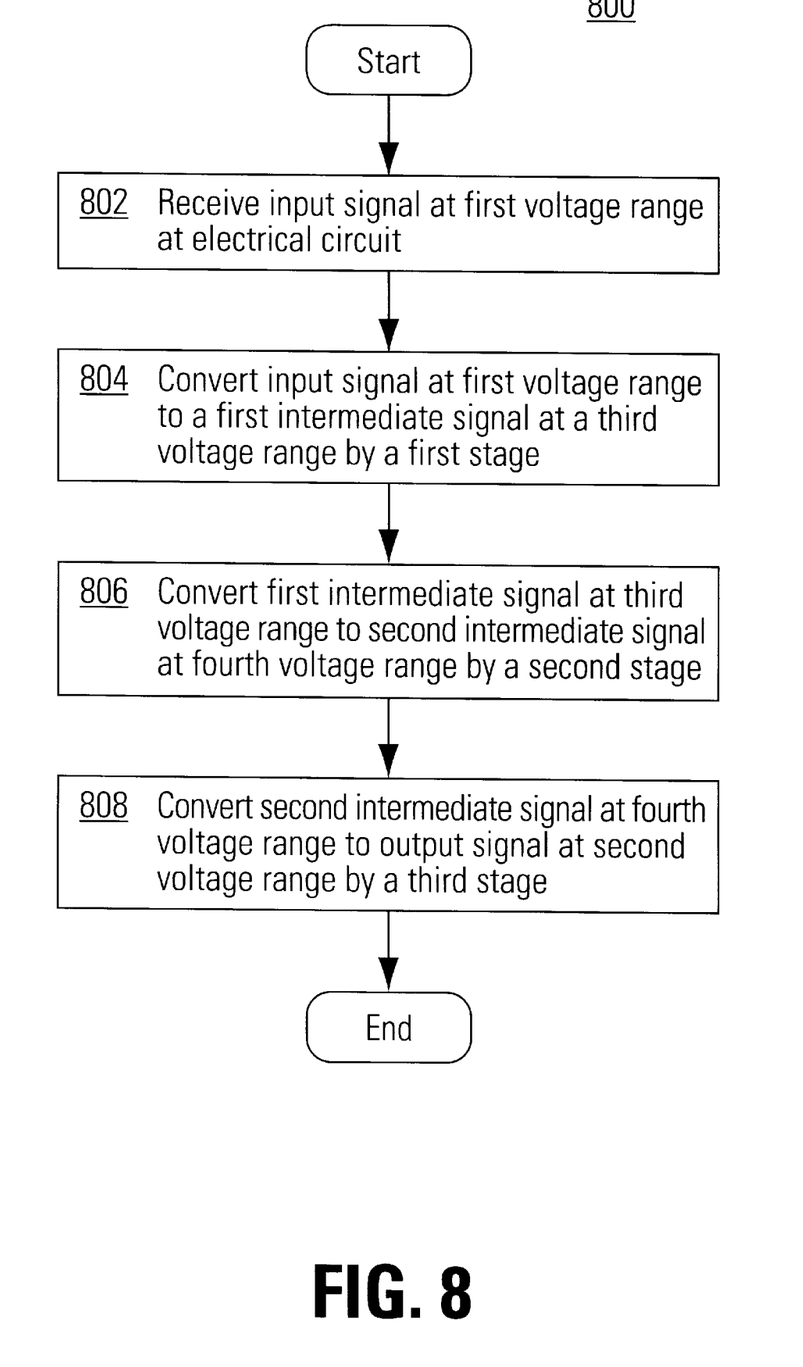
FIG. 8 is flow chart of steps performed to change an input voltage to the desired output voltage in accordance with one embodiment of the present invention.

Referring now to FIG. 8, a flowchart 800 of steps performed by the present voltage buffer circuit 300 of FIGS. 3–6 is illustrated. As shown in FIG. 8, the first step 802 is for receiving an input signal at a first voltage at an electrical circuit. First voltage level of input signal is at a level that exceeds the capability of the integrated circuit (IC) core. Hence, the voltage level of input signal must be reduced before it is provided to the IC core.

Step 804 converts input signal at first voltage to a first intermediate signal at a third voltage by a first stage. In one embodiment, the voltage is reduced by using a power source at a voltage, e.g. third voltage, that is lower than the maximum voltage, e.g. first voltage, of input signal. In one embodiment, transistors are utilized to isolate input signal voltage from first intermediate signal. Instead a power source provides a maximum voltage level, e.g. third voltage, for first intermediate signal that is less than maximum voltage, e.g. first voltage, of input signal.

Step 806 converts first intermediate signal at said third voltage to a second intermediate signal at a fourth voltage by a second stage. In one embodiment, transistors are utilized to isolate first intermediate signal voltage from second intermediate signal. Instead a power source provides a maximum voltage level, e.g. fourth voltage, for second intermediate signal that is less than maximum voltage, e.g. third voltage, of first intermediate signal. In this manner, the voltage level is incrementally reduced.

Finally, step 808 converts second intermediate signal at a fourth voltage to the output signal at a second voltage by a third stage. In one embodiment, transistors are utilized to isolate second intermediate signal voltage from output signal. Instead a power source provides a maximum voltage level, e.g. second voltage, for output signal that is less than maximum voltage, e.g. fourth voltage, of second intermediate signal. In this manner, the voltage level is incrementally reduced.

Figure 9:
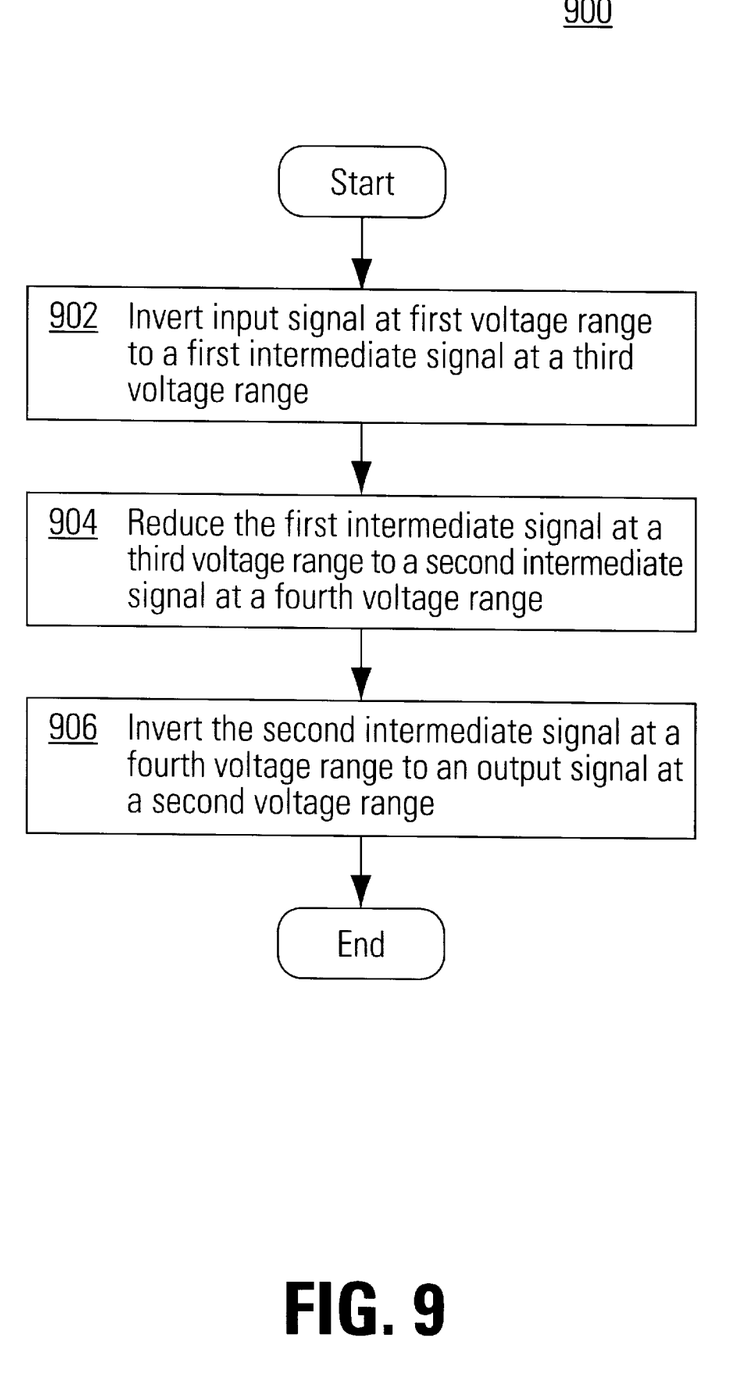
FIG. 9 is flow chart of steps performed to change an input voltage to the desired output voltage in accordance with one embodiment of the present invention.

Referring now to FIG. 9, a flowchart 900 of steps performed by the present voltage buffer circuit 300 of FIGS. 3–6 is presented. Step 902 inverts the input signal at a first voltage to a first intermediate signal at a third voltage. Hence, when input signal is at a high logic condition, first intermediate signal is at a low logic condition. Likewise, when input signal is at a low logic condition, first intermediate signal is at a high logic condition. In one embodiment, a CMOS transistor is used to invert input signal to first intermediate signal. The CMOS transistor has a separate power supply having a maximum voltage less than that of input signal.

Step 904 reduces the first intermediate signal at a third voltage to a second intermediate signal at a fourth voltage. In one embodiment, second stage, unlike first stage, does not invert first intermediate signal. Instead, the second stage simply reduces the high logic level of first intermediate signal to a lower value for the second intermediate signal high logic level. Alternatively, if first intermediate signal is at low logic level, second stage keeps ground voltage as low logic level for second intermediate signal. In one embodiment, second stage uses transistors to isolate first intermediate voltage level from second intermediate voltage. A power source at a voltage less than the maximum voltage of first intermediate signal is provided for second intermediate signal.

Finally, step 906 inverts the second intermediate signal at a fourth voltage to an output signal at a second voltage. Thus, if second intermediate signal is a low logic level, step 906 inverts it such that output signal is a high logic level. In one embodiment, the high logic voltage level of the output signal is less than the high logic voltage level of the second intermediate signal. Hence, the logic condition, e.g. high or low, of the input signal is maintained while maximum voltage is reduced.

In one embodiment that illustrates to steps performed in flowchart 800 of FIG. 8 and flowchart 900 of FIG. 9, the voltage level of input signal is reduced to a voltage level of output signal that is acceptable to the IC core. The following table illustrates the approximate voltage levels of one embodiment of the present invention.

TABLE 1.0

Voltage Buffer levels for HIGH Input Signal

| SIGNAL | LOGIC LEVEL | VOLTAGE LEVEL |
|---|---|---|
| Input signal | High | 5 volts |
| First intermediate signal | Low | 0 volts |
| Second intermediate signal | Low | 0 volts |
| Output signal | High | 1.8 volts |

Table 2.0

Voltage Buffer levels for LOW Input Signal

| SIGNAL | LOGIC LEVEL | VOLTAGE LEVEL |
|---|---|---|
| Input signal | Low | 0 volts |
| First intermediate signal | High | 3.3 volts |
| Second intermediate signal | High | 1.8 volts |
| Output signal | Low | 0 volts |

The IC core was designed to operated at logic high voltages of 1.8 volts instead of 5 volts or 3.3 volts. If the higher voltages of 5 volts or 3.3 volts were supplied to IC core as a logic high, the IC core would prematurely fail. As Table 1.0 and 2.0 indicate, the voltage buffer circuit 300 of FIGS. 3–6 and methods 800 and 900 of FIGS. 8 and 9 reduce the voltage level of the signal to a level that is acceptable to the IC core. Consequently, the IC core has robust performance and long life because it is not exposed to excessively high voltage levels.

In summary, the present invention provides an apparatus and a method for a high to low voltage buffer circuit that reduces the I/O signal voltage to a level that the IC core can withstand. The present invention further provides a voltage buffer circuit that operates with low power consumption and with a low propagation delay time (e.g. faster switching speed). Finally, the present invention has a robust capability for managing the required voltage levels without a quick or significant degradation in performance.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the claims appended hereto and their equivalents.

I claim:

1. A voltage-buffer circuit for changing an input signal at a first voltage range to an output signal at a second voltage range, said voltage-buffer circuit comprising:
   an input lead for receiving said input signal at said first voltage range;
   a plurality of transistors coupled to said input lead, said plurality of transistors arranged into a plurality of stages, at least one of said plurality of transistors having a gate oxide of a first thickness and at least another one of said plurality of transistors having a gate oxide of a second thickness, said first thickness being less than said second thickness, said plurality of transistors for converting said input signal at said first voltage range to said output signal at said second voltage range, wherein a maximum voltage of said second voltage range is less than a maximum voltage of said first voltage range, and wherein said output signal has a waveform shape that is approximately the same as a waveform shape of said input signal; and
   an output lead coupled to said plurality of transistors, said output lead for receiving said output signal at said second voltage range from said plurality of transistors.

2. The voltage buffer circuit as recited in claim 1 wherein at least one of said plurality of transistors is of a first conductivity-type and at least another one of said plurality of transistors is of a second conductivity-type.

3. The voltage buffer circuit of claim 2 wherein said first conductivity-type is a p-type conductivity and said second conductivity-type is an n-type conductivity.

4. The voltage buffer circuit of claim 1 wherein said plurality of stages of said plurality of transistors further comprise:
   a first stage having at least one of said plurality of transistors coupled to a first power source at a third voltage;
   a second stage coupled to said first stage, said second stage having at least another one of said plurality of transistors coupled to a second power source at a fourth voltage; and
   a third stage coupled to said second stage, said third stage having at least a further one of said plurality of transistors coupled to a third power source at a fifth voltage.

5. The voltage-buffer circuit of claim 4 wherein said first stage further comprises:
   a first transistor of a first conductivity-type having a source, a drain, a gate, and a gate oxide of said second thickness, said source of said first transistor coupled to said first power source at said third voltage; and
   a second transistor of a second conductivity-type having a source, a drain, a gate, and a gate oxide of said second thickness, said drain of said second transistor and said drain of said first transistor coupled to a node in said voltage buffer circuit, said source of said second transistor coupled to ground, said gate of said first transistor and said gate of said second transistor coupled to said input lead.

6. The voltage-buffer circuit of claim 4 wherein said second stage further comprises:
   a first transistor of a second conductivity-type having a source, a drain, a gate, and a gate oxide of said first thickness, said drain of said first transistor coupled to said second power source at said fourth voltage; and
   a second transistor of a second conductivity-type having a source, a drain, a gate, and a gate oxide of said first thickness, said drain of said second transistor and said source of said first transistor coupled to a node in said second stage, said source of said second transistor and said gate of said first transistor coupled to a node in said first stage, said gate of said second transistor coupled to a fourth power source at a sixth voltage.

7. The voltage buffer circuit of claim 4 wherein said third stage further comprises:
   a first transistor of a first conductivity-type having a source, a drain, a gate, and a gate oxide of said first thickness, said source of said first transistor coupled to said third power source at said fifth voltage; and
   a second transistor of a second conductivity-type having a source, a drain, a gate, and a gate oxide of said second thickness, said drain of said second transistor and said drain of said first transistor coupled to said output lead, said source of said second transistor coupled to ground, said gate of said first transistor coupled to a node in said second stage, said gate of said second transistor coupled to a node in said first stage.

8. A method for changing an input signal at a first voltage range to an output signal at a second voltage range in an electrical circuit comprising a plurality of transistors, said method comprising the steps of:
   a) receiving said input signal at said first voltage range at said electrical circuit;
   b) converting said input signal at said first voltage range to an said output signal at said second voltage range using said plurality of transistors wherein at least one of said plurality of transistors has a thin gate oxide and at least another one of said plurality of transistors has a thick gate oxide, wherein a maximum voltage of said second voltage range is less than a maximum voltage of said first voltage range, and wherein said output signal has a waveform shape that is approximately the same as a waveform shape of said input signal.

9. The method as described in claim 8 wherein said step b) comprises the steps of:
   b1) converting said input signal at said first voltage range to a first intermediate signal at a third voltage range by a first stage;

b2) converting said first intermediate signal at said third voltage range to a second intermediate signal at a fourth voltage range by a second stage; and b3) converting said second intermediate signal at said fourth voltage range to said output signal at said second voltage range by a third stage.

10. The method as described in claim 9 wherein said step b1) comprises the step of:

inverting said input signal at said first voltage range to said first intermediate signal at said third voltage range.

11. The method as described in claim 9 wherein said step b2) comprises the step of:

reducing said first intermediate signal at said third voltage range to said second intermediate signal at said fourth voltage range.

12. The method as described in claim 9 wherein said step b2) comprises the step of:

reducing said first intermediate signal at said third voltage level to said second intermediate signal at said fourth voltage range where said second intermediate signal is not inverted from said first intermediate signal.

13. The method as described in claim 9 wherein said step b3) comprises the step of:

inverting said second intermediate signal at said fourth voltage range to said output signal at said second voltage range.

14. The method as described in claim 10, wherein said step of inverting said input signal at said first voltage range to said first intermediate signal at said third voltage range comprises the step of:

receiving said input signal having said first voltage range at a gate of a first transistor in said first stage and at a gate of a second transistor in said first stage, said first transistor and said second transistor forming an inverter, said first transistor and said second transistor having said thick gate oxide;

receiving a fifth voltage from a power source in said first stage at a source of said first transistor;

coupling a source of said second transistor to ground; and receiving said first intermediate signal at said third voltage range at a node, said node coupled to a drain of said first transistor and to a drain of said second transistor.

15. The method as described in claim 11, wherein said step of reducing said first intermediate signal at said third voltage range to said second intermediate signal at said fourth voltage range comprises the step of:

receiving said first intermediate signal having said third voltage range at a gate of a first transistor in said second stage and at a drain of a second transistor in said second stage, said first transistor and said second transistor having said thin gate oxide;

receiving a sixth voltage from a first power source in said second stage at a drain of said first transistor, said sixth voltage of said first power source in said second stage being not more than a fifth voltage of a power source in said first stage;

receiving a seventh voltage from a second power source in said second stage at a gate of said second transistor, said seventh voltage of said second power source in said second stage being not more than said fifth voltage of said power source in said first stage; and receiving said second intermediate signal having said fourth voltage at a node, said node coupled to a source of said first transistor and to a drain of said second transistor.

16. The method as described in claim 12, wherein said step of reducing said first intermediate signal at said third voltage range to said second intermediate signal at said fourth voltage range where said second intermediate signal is not inverted from said first intermediate signal comprises the step of:

receiving said first intermediate signal having said third voltage range at a gate of a first transistor in said second stage and at a drain of a second transistor in said second stage, said first transistor and said second transistor having said thin gate oxide;

receiving a sixth voltage from a first power source at a drain of said first transistor in said second stage, said sixth voltage of said first power source being not more than a fifth voltage of a power source in said first stage;

receiving a seventh voltage from a second power source at a gate of said second transistor in said second stage, said seventh voltage of said second power source being not more than said fifth voltage of said power source in said first stage; and receiving said second intermediate signal having said fourth voltage at a node, said second intermediate signal at a fourth voltage not inverted from said first intermediate signal at said third voltage, said node coupled to a source of said first transistor and to a drain of said second transistor.

17. The method as described in claim 13, wherein said step of inverting said second intermediate signal at said fourth voltage range to said output signal at said second voltage range comprises the step of:

receiving said second intermediate signal at said fourth voltage range at a gate of a first transistor in said third stage, said first transistor having said thin gate oxide;

receiving an eighth voltage from a power source at a source of said first transistor in said third stage, said eighth voltage from said power source being not more than said third voltage of said first intermediate signal;

receiving said third voltage from said first intermediate signal at a gate of a second transistor in said third stage, said second transistor coupled to said first transistor to form an inverter, said second transistor having said thick gate oxide;

coupling a source of said second transistor to ground; and receiving said output signal at said second voltage range at an output lead, said output lead coupled to a drain of said first transistor and to a drain of said second transistor.

18. A voltage-buffer circuit for changing an input signal at a first voltage range to an output signal at a second voltage range, said voltage-buffer circuit comprising:

an input lead for receiving said input signal at said first voltage range;

a plurality of transistors coupled to said input lead, said plurality of transistors arranged into a plurality of stages, at least one of said plurality of transistors having a gate oxide of a first thickness and at least another one of said plurality of transistors having a gate oxide of a second thickness, said first thickness being less than said second thickness, said plurality of transistors for converting said input signal at said first voltage range to said output signal at said second voltage, wherein said plurality of stages includes a first stage, a second stage, and a third stage, said first stage having at least one of said plurality of transistors coupled to a first power source at a third voltage, said second stage coupled to said first stage, said second stage having at least another one of said plurality of transistors coupled to a second power source at a fourth voltage, and said third stage coupled to said second stage, said third stage having at least a further one of said plurality of transistors coupled to a third power source at a fifth voltage; and an output lead coupled to said plurality of transistors, said output lead for receiving said output signal at said second voltage range from said plurality of transistors.

19. The voltage-buffer circuit of claim 18 wherein said first stage further comprises:
   a first transistor of a first conductivity-type having a source, a drain, a gate, and a gate oxide of said second thickness, said source of said first transistor coupled to said first power source at said third voltage; and
   a second transistor of a second conductivity-type having a source, a drain, a gate, and a gate oxide of said second thickness, said drain of said second transistor and said drain of said first transistor coupled to a node in said voltage buffer circuit, said source of said second transistor coupled to ground, said gate of said first transistor and said gate of said second transistor coupled to said input lead.

20. The voltage-buffer circuit of claim 18 wherein said second stage further comprises:
   a first transistor of a second conductivity-type having a source, a drain, a gate, and a gate oxide of said first thickness, said drain of said first transistor coupled to said second power source at said fourth voltage; and
   a second transistor of a second conductivity-type having a source, a drain, a gate, and a gate oxide of said first thickness, said drain of said second transistor and source of said first transistor coupled to a node in said second stage, said source of said second transistor and said gate of said first transistor coupled to a node in said first stage, said gate of said second transistor coupled to a fourth power source at a sixth voltage.

21. The voltage buffer circuit of claim 18 wherein said third stage further comprises:
   a first transistor of a first conductivity-type having a source, a drain, a gate, and a gate oxide of said first thickness, said source of said first transistor coupled to said third power source at said fifth voltage; and
   a second transistor of a second conductivity-type having a source, a drain, a gate, and a gate oxide of said second thickness, said drain of said second transistor and said drain of said first transistor coupled to said output lead, said source of said second transistor coupled to ground, said gate of said first transistor coupled to a node in said second stage, said gate of said second transistor coupled to a node in said first stage.

22. A method for changing an input signal at a first voltage range to an output signal at a second voltage range in an electrical circuit comprising a plurality of transistors, said method comprising the steps of:
   a) receiving said input signal at said first voltage range at said electrical circuit;
   b) converting said input signal at said first voltage range to said output signal at said second voltage range using said plurality of transistors wherein at least one of said plurality of transistors has a thin gate oxide and at least another one of said plurality of transistors has a thick gate oxide, said step b) further including the steps of:
      b1) inverting said input signal at said first voltage range to a first intermediate signal at a third voltage range by a first stage, said step b1) further including the steps of:
         i) receiving said input signal having said first voltage range at a gate of a first transistor in said first stage and at a gate of a second transistor in said first stage, said first transistor and said second transistor forming an inverter, said first transistor and said second transistor having said hick gate oxide;
         ii) receiving a fifth voltage from a power source in said first stage at a source of said first transistor; and
         iii) coupling a source of said second transistor to ground; and
      receiving said first intermediate signal at said third voltage range at a node, said node coupled to a drain of said first transistor and to a drain of said second transistor;
      b2) reducing said first intermediate signal at said third voltage range to a second intermediate signal at a fourth voltage range by a second stage; and
      b3) inverting said second intermediate signal at said fourth voltage range to said output signal at said second voltage range by a third stage.

23. The method as described in claim 22, wherein said step of reducing said first intermediate signal at said third voltage range to said second intermediate signal at said fourth voltage range comprises the step of:
   receiving said first intermediate signal having said third voltage range at a gate of a first transistor in said second stage and at a drain of a second transistor in said second stage, said first transistor and said second transistor having said thin gate oxide;
   receiving a sixth voltage from a first power source in said second stage at a drain of said first transistor, said sixth voltage of said first power source in said second stage being not more than a fifth voltage of a power source in said first stage;
   receiving a seventh voltage from a second power source in said second stage at a gate of said second transistor, said seventh voltage of said second power source in said second stage being not more than said fifth voltage of said power source in said first stage; and
   receiving said second intermediate signal having said fourth voltage at a node, said node coupled to a source of said first transistor and to a drain of said second transistor.

24. The method as described in claim 22, wherein said step of reducing said first intermediate signal at said third voltage range to said second intermediate signal at said fourth voltage range comprises the step of:
   receiving said first intermediate signal having said third voltage range at a gate of a first transistor in said second stage and at a drain of a second transistor in said second stage, said first transistor and said second transistor having said thin gate oxide;
   receiving a sixth voltage from a first power source in said second stage at a drain of said first transistor, said sixth voltage of said first power source in said second stage being not more than a fifth voltage of a power source in said first stage;
   receiving a seventh voltage from a second power source in said second stage at a gate of said second transistor, said seventh voltage of said second power source being not more than said fifth voltage of said power source in said first stage; and
   receiving said second intermediate signal having said fourth voltage at a node, said second intermediate signal at a fourth voltage not inverted from said first intermediate signal at said third voltage, said node coupled to a source of said first transistor and to a drain of said second transistor.

25. The method as described in claim 22, wherein said step of inverting said second intermediate signal at said fourth voltage range to said output signal at said second voltage range comprises the step of:

receiving said second intermediate signal at said fourth voltage range at a gate of a first transistor in said third stage, said first transistor having said thin gate oxide;

receiving an eighth voltage from a power source in said third stage at a source of said first transistor, said eighth voltage from said power source being not more than said third voltage of said first intermediate signal;

receiving said third voltage from said first intermediate signal at a gate of a second transistor in said third stage, said second transistor coupled to said first transistor to form an inverter, said second transistor having a thick gate oxide;

coupling a source of said second transistor to ground; and receiving said output signal at said second voltage range at an output lead, said output lead coupled to a drain of said first transistor and to a drain of said second transistor.

* * * * *